United States Patent
Sinangil et al.

(10) Patent No.: US 9,418,714 B2
(45) Date of Patent: Aug. 16, 2016

(54) SENSE AMPLIFIER WITH TRANSISTOR THRESHOLD COMPENSATION

(71) Applicant: NVIDIA Corporation, Santa Clara, CA (US)

(72) Inventors: Mahmut E. Sinangil, Medford, MA (US); John W. Poulton, Chapel Hill, NC (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/941,151

(22) Filed: Jul. 12, 2013

(65) Prior Publication Data

US 2015/0016183 A1    Jan. 15, 2015

(51) Int. Cl.
| | |
|---|---|
| *G11C 7/06* | (2006.01) |
| *G11C 29/02* | (2006.01) |
| *G11C 11/419* | (2006.01) |
| *G11C 11/41* | (2006.01) |

(52) U.S. Cl.
CPC .............. *G11C 7/065* (2013.01); *G11C 29/026* (2013.01); *G11C 29/028* (2013.01); *G11C 11/41* (2013.01); *G11C 11/419* (2013.01)

(58) Field of Classification Search
CPC ...... G11C 7/065; G11C 11/419; G11C 11/41; G11C 29/026; G11C 29/028
USPC ............ 365/149, 154, 185.24, 196, 203, 205, 365/210.11
See application file for complete search history.

(56) References Cited

U.S. PATENT DOCUMENTS

| | | | |
|---|---|---|---|
| 3,241,122 A | 3/1966 | Bardell | |
| 6,304,505 B1 * | 10/2001 | Forbes et al. | 365/205 |
| 6,646,938 B2 | 11/2003 | Kodama | |
| 7,498,850 B2 * | 3/2009 | Hendrickson | 327/63 |
| 7,499,347 B2 | 3/2009 | Chen et al. | |
| 8,164,934 B2 | 4/2012 | Watanabe et al. | |
| 8,570,818 B2 | 10/2013 | Jung et al. | |
| 8,760,208 B2 | 6/2014 | Dike et al. | |
| 8,830,766 B2 | 9/2014 | Sahu | |
| 2002/0089364 A1 | 7/2002 | Goldgeisser et al. | |
| 2005/0128844 A1 * | 6/2005 | Yamagami | 365/207 |
| 2007/0180006 A1 | 8/2007 | Gyoten et al. | |
| 2009/0168499 A1 | 7/2009 | Kushida et al. | |
| 2013/0129083 A1 | 5/2013 | Fujino | |
| 2014/0003160 A1 | 1/2014 | Trivedi et al. | |
| 2014/0354330 A1 | 12/2014 | Gotterba et al. | |
| 2014/0355334 A1 | 12/2014 | Gotterba et al. | |
| 2014/0355362 A1 | 12/2014 | Wang et al. | |

\* cited by examiner

*Primary Examiner* — Vu Le
*Assistant Examiner* — Sung Cho

(57) ABSTRACT

One embodiment provides, in a sense amplifier for an electronic memory array in which a selected memory cell drives a developing voltage differential according to a logic state of the memory cell, a method to store the logic state. The method includes poising source voltages of first and second transistors at levels offset, respectively, by threshold voltages of the first and second transistors. The method also includes applying the voltage differential between a gate of the first transistor and a gate of the second transistor, the first and second transistors configured to oppose each other in a cross-coupled inverter stage of the sense amplifier.

8 Claims, 7 Drawing Sheets

SENSE AMPLIFIER WITH TRANSISTOR THRESHOLD COMPENSATION

This invention was made with Government support under LLNS subcontract B599861 awarded by DOE, and with Government support under Agreement HR0011-13-3-0001 awarded by DARPA. The Government has certain rights in this invention.

BACKGROUND

A sense amplifier is an electronic circuit that senses a relatively small voltage differential and amplifies it to a stable and recognizable logic level. Sense amplifiers are used in various kinds of electronic circuitry, including computer memory. In static random-access memory (SRAM), for example, a sense amplifier may be associated with each column of an array of memory cells and configured to read the voltage differentials stored in the cells. In particular, a sense amplifier may be linked to the pair of complementary bit lines that run down each column of memory cells.

To provide high bit density and low power consumption, the transistors of an SRAM are extremely small, having a limited capacity to source and sink current. Nevertheless, the bit lines may present a significant capacitive load, such that during a read operation, the voltage differential stored in the selected cell does not appear instantly on the bit lines, but develops over some period of time. Accordingly, a sense amplifier that triggers on a smaller voltage differential will be able to expose the stored logic state earlier in the read cycle, thereby reducing access time for the SRAM. In practice, it is the input offset voltage (IOV) of a sense amplifier that determines the minimum voltage differential that can be sensed. Accordingly, it is desirable to minimize the IOV.

IOV in a sense-amplifier circuit arises mostly from variability in the transistors of the input stage of the circuit. This effect may be exacerbated by the deep sub-micro architecture of the state-of-the art complementary metal-oxide semiconductor (CMOS) process, which provides high-density, low-power SRAM. A straightforward approach to reducing IOV is upsizing the transistors of the sense amplifier. This approach is disadvantageous in SRAM applications, however, due to the chip area it requires. Other approaches include offset trimming and offset calibration on start-up. These approaches increase operational complexity in addition to requiring extra chip area.

DETAILED DESCRIPTION

Figure 1:
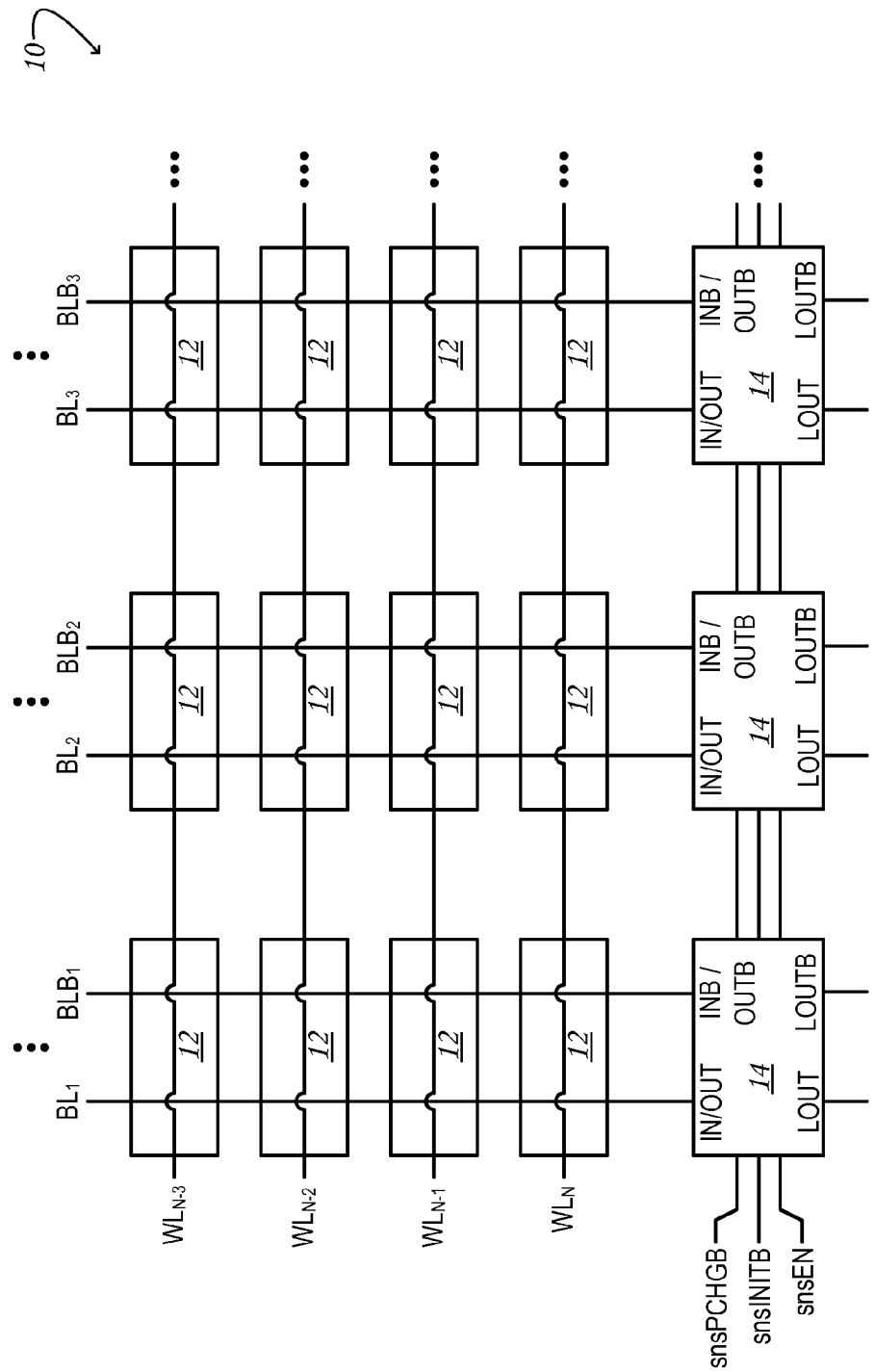
FIG. 1 shows aspects of an example SRAM in accordance with an embodiment of this disclosure.

Aspects of this disclosure will now be described by example and with reference to the illustrated embodiments listed above. Components, process steps, and other elements that may be substantially the same in one or more embodiments are identified coordinately and are described with minimal repetition. It will be noted, however, that elements identified coordinately may also differ to some degree. It will be further noted that the drawing figures included in this disclosure are schematic and generally not drawn to scale. Rather, the various drawing scales, aspect ratios, and numbers of components shown in the figures may be purposely distorted to make certain features or relationships easier to see.

FIG. 1 shows aspects of SRAM 10 in one embodiment. The SRAM includes a rectangular array of one-bit memory cells 12. Each horizontal row i of memory cells is addressed in common by a word line $WL_i$. The illustrated SRAM includes N rows and word lines and any suitable number of columns—16, 32, or 64 columns, for example. Each vertical column j of memory cells is addressed in common by a complementary pair of bit lines, denoted $BL_j$ and $BLB_j$. It will be noted that the suffixes 'B' and 'b', above and elsewhere, stand for 'bar' and denote the logical complement of the parameter they follow. Thus, $BLB_j$ is the logical complement of $BL_j$; it can also be written $\overline{BL_j}$ with an overscore. Similarly, inb/outb is the logical complement of in/out, LOUTB is the logical complement of LOUT, etc.

Continuing in FIG. 1, each column of memory cells 12 is connected to a sense amplifier 14 through the complementary pair of bit lines associated with that column. During a memory-read operation, each selected memory cell drives a developing voltage differential across its associated bit lines, depending on its stored logic state. The sense amplifiers sense the relatively small voltage differentials developing on the bit lines and amplify them to stable and recognizable logic levels—e.g., to rail voltages. In the embodiment of FIG. 1, the sense amplifiers are connected to three different control lines: snsEN, snsINITB, and snsPCHGB. These lines may control the entire row of sense amplifiers, as shown, or the row may be divided into groups of one or more sense amplifiers, with separate control lines for each group. Furthermore, although one sense amplifier may be associated with each column of memory cells, as shown in the drawing, this feature is by no means necessary. In alternative embodiments, suitable multiplexing circuitry—e.g., circuitry based on PMOS pass gates or transmission gates—may be used to selectably connect a given sense amplifier to one of several BL/BLB lines.

Figure 2:
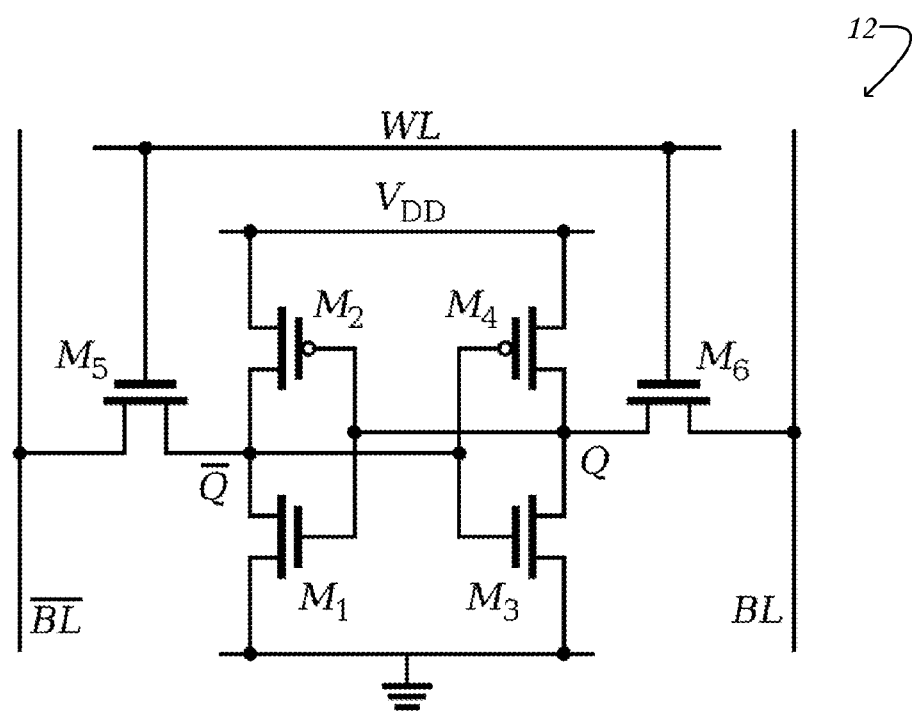
FIG. 2 shows aspects of an example SRAM memory cell in accordance with an embodiment of this disclosure.

FIG. 2 shows aspects of an example SRAM memory cell 12 in one embodiment. The illustrated memory cell is a six-transistor (6T) memory cell, in which each transistor is a metal-oxide semiconductor field-effect transistor (MOSFET). Of these transistors, $M_1$ through $M_4$ are configured as cross-coupled inverters, which together store the logic state of the memory cell. Transistors $M_5$ and $M_6$ are access transistors that selectably connect the memory cell to shared bit lines BL and BLB. More particularly, the selected memory cell is connected to the bit lines for read and write operations when word line WL is driven high. Although FIG. 2 shows a 6T cell, this disclosure is fully consistent with SRAM having more or fewer transistors per cell—4T, 8T, 10T, etc.

Figure 3:
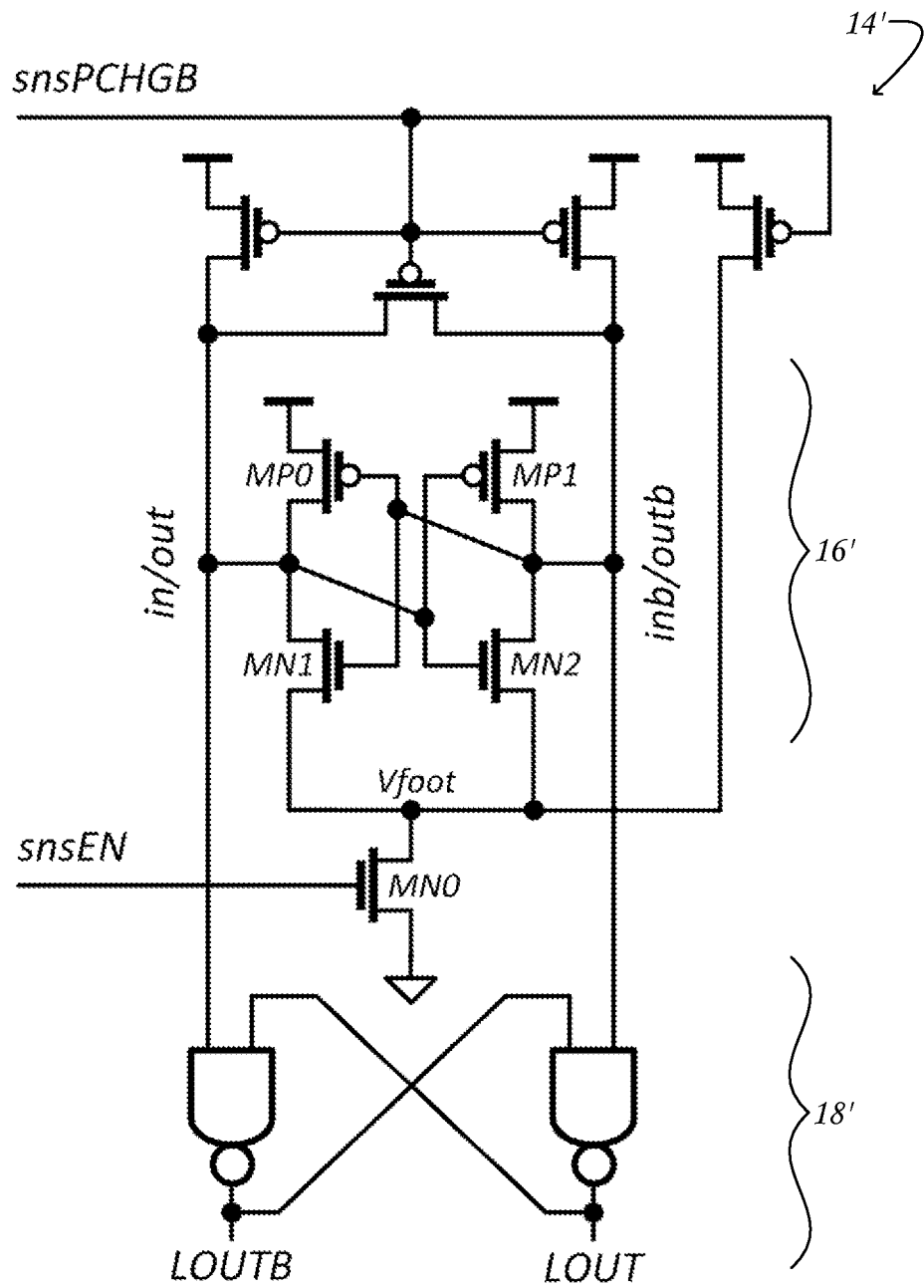
FIG. 3 shows aspects of a state-of-the-art sense amplifier.

FIG. 3 shows aspects of a state-of-the-art sense amplifier 14' for an SRAM array. This sense-amplifier includes a cross-coupled inverter stage 16', based on opposing p-channel MOSFETs MP0 and MP1 and opposing n-channel MOSFETs MN1 and MN2. The cross-coupled inverter stage is configured to sense and amplify a voltage differential applied between the gates of transistors MN1/MP0 (the inb/outb node) and the gates of transistors MN2/MP1 (the in/out node), and to store the logic state corresponding to the amplified voltage differential. In one embodiment, the complementary state-sensing nodes may be coupled directly to bit lines BL and BLB, respectively, of any column of SRAM memory cells 12. In other embodiments, where the sense amplifier is shared across multiple columns, the in/out and inb/outb nodes may be decoupled from the bit lines through PMOS pass gates or transmission gates. Continuing in FIG. 3, an SR latch stage 18' is arranged at the output of the cross-coupled inverter stage to maintain the previous stored state of the sense amplifier until the next read operation is completed.

With sense amplifier 14', a read operation begins by precharging both bit lines to an initial voltage, which is typically chosen to be the positive supply voltage $V_{dd}$. This is accomplished by asserting the snsPCHGB control line. It will be noted that the term 'assert' is used to indicate that the given control line is transitioned to its active logic state (low in the case of snsPCHGB). In contrast, the term 'drop' is used to indicate that the control line is transitioned to its inactive logic state.

Continuing in FIG. 3, the snsEN control line also is held low during precharge of the bit lines. In this state, MP0, MP1, MN1 and MN2 are turned off. Then, the snsPCHGB control line is dropped (pulled high), which causes the in/out and inb/outb nodes to float. The sense amplifier is now ready to read data from a memory cell 12.

Referring back to FIGS. 1 and 2, the word line WL for the selected row is now asserted. This action enables charge from the selected memory cell to flow out along the bit lines. Such charge creates a small but increasing voltage differential between corresponding BL/BLB pairs. After a predetermined delay following assertion of the word line, the snsEN control line of sense amplifier 14' is asserted (pulled high), which enables the sense amplifier to amplify the developing voltage differential to a rail-to-rail output. In particular, assertion of snsEN causes MN0 to turn on, so that Vfoot is pulled to ground. This action causes either MN1 or MN2 to turn on, depending on the relative gate voltages of these transistors—viz., in/out versus inb/outb. For instance, if the in/out node voltage is higher than the inb/outb node voltage, then the gate overdrive of MN2 will be greater than that of MN1, assuming that MN1 and MN2 are equivalent. Thus, MN2 will pull down inb/outb more strongly than MN1 pulls down in/out, amplifying the initial voltage differential between in/out and inb/outb. When inb/outb drops below a threshold voltage level, MP0 starts to turn on and actively pulls in/out higher still. Thus, the internal feedback between the cross-coupled inverters eventually drives in/out to $V_{dd}$ and inb/outb to ground (or vice versa, if inb/outb was initially higher than in/out). As the internal node voltages approach the rails, SR latch 18 latches the stored logic state, maintaining latched outputs LOUT and LOUTB even after snsEN is pulled low and snsPCHGB is pulled high again.

From the foregoing description, it is evident that transistor mismatch in cross-coupled inverter stage 16'—particularly mismatch of MN1 and MN2—will result in an IOV in sense amplifier 14'. This IOV can be referenced to internal nodes in/out and inb/outb. If the IOV of in/out were 50 millivolts (mV) relative to inb/outb, for instance, then the in/out node would have to exceed inb/outb by at least 50 mV in order for the sense amplifier to operate as described above. Thus, memory cell 12 would have to impart at least 50 mV of potential difference across the bit lines before a reliable read event could initiate. If the IOV were reduced, say, to 25 mV, then the memory cell would be readable having imparted a significantly lower potential difference across the bit lines. As a 25-mV potential difference develops earlier in the read cycle, a sense amplifier with better matched or compensated transistors may offer an attractively shorter access time for SRAM read operations, while preserving high bit density and low power consumption.

Figure 4:
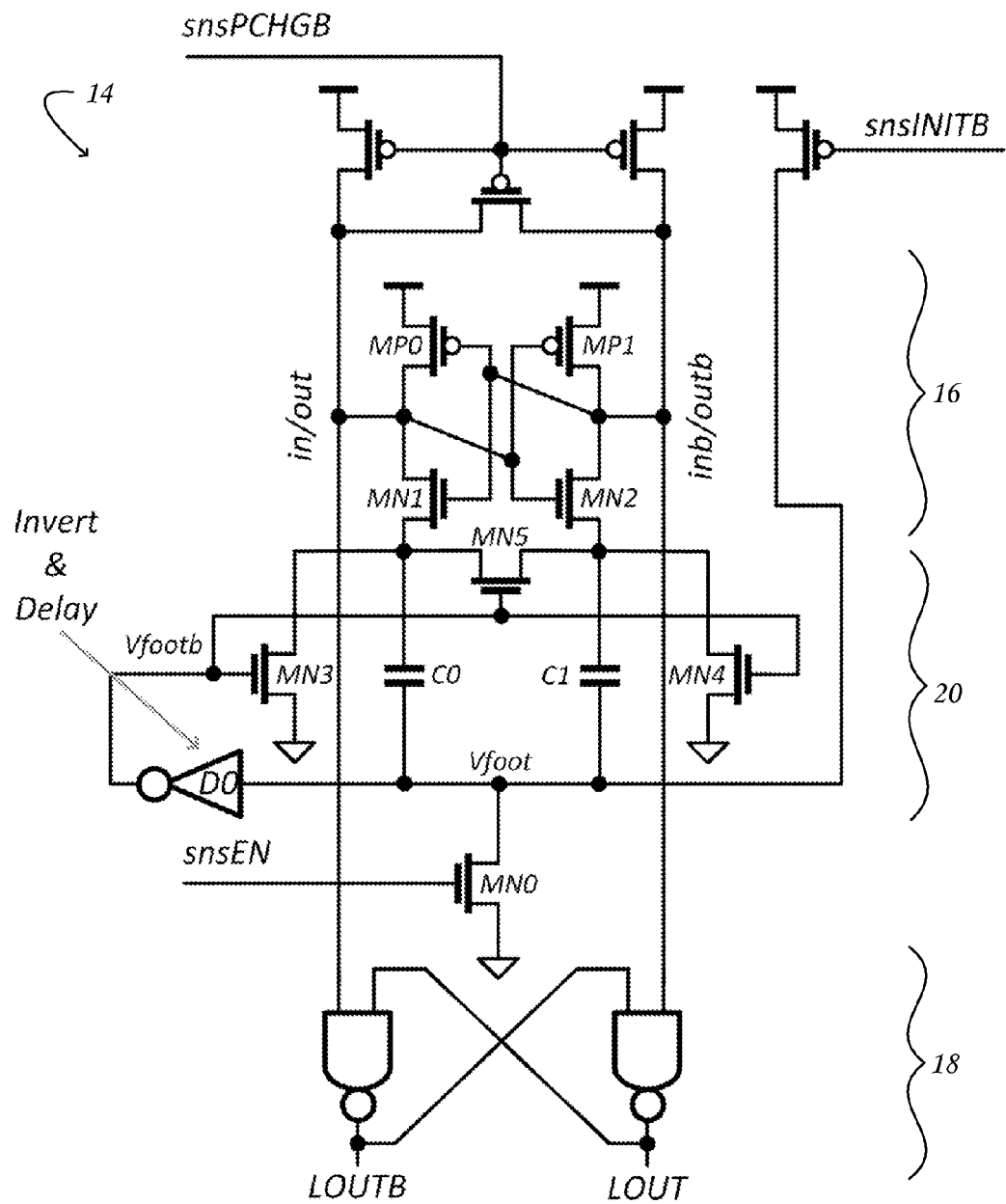
FIG. 4 shows aspects of an example sense amplifier in accordance with an embodiment of this disclosure.

To address these issues, another sense amplifier 14 for an SRAM array is presented in FIG. 4. In this circuit, an IOV-reduction scheme is used to compensate for the effects of transistor mismatch. To that end, sense amplifier 14 includes a compensation stage 20, in addition to cross-coupled inverter stage 16 and latch stage 18. Based on the FIG. 3 description, it will be understood that mismatch between n-channel MOSFETs MN1 and MN2 contribute most to the IOV of sense-amplifier 14'. To effect IOV compensation, compensation stage 20 is configured to poise the source voltages of transistors MN1 and MN2 at levels offset by the threshold voltages of these transistors.

As shown in FIG. 4, compensation stage 20 includes capacitors C0 and C1, which share a common Vfoot node. The plates of the capacitors opposite the Vfoot node are coupled, respectively, to the source terminals of MN1 and MN2. A snsINITB control line is operatively coupled to the Vfoot node so that assertion of snsINITB drives Vfoot to a common voltage higher than ground voltage as the offset voltage levels of MN1 and MN2 are stored in C0 and C1. As described in further detail below, the compensation stage is configured to store the offset voltage level of MN1 on C0, and the offset voltage level of MN2 on C1.

Compensation stage 20 also includes a set of transistors—MN3, MN4, and MN5—which are configured to null the source voltages of MN1 and MN2 to ground voltage after a predetermined delay, during which the source voltages remain poised at the offset voltage levels. The purpose of the delay is to define a time interval over which the compensation scheme is active, and after which the sense amplifier functions more conventionally, as further described below. To provide the delay, sense amplifier 14 includes a delay element D0, which is configured to control the set of transistors such that the source voltages of MN1 and MN2 are nulled only after the predetermined delay. In one embodiment, the delay element D0 may include an inverter chain comprising a series of inverters arranged front to back—three to five inverters, for example.

To understand the functioning of sense amplifier 14, it is helpful to consider the overall logic state well into a read operation, when assertion of the snsEN control line has pulled the Vfoot node to a low logic level. This action ensures, inter alia, that the lower plates of capacitors C0 and C1 are discharged to ground. Driven high via inverter D0, the Vfootb node has turned on transistors MN3, MN4, and M5, thereby discharging the upper plates of the capacitors as well. Thus, in advance of a subsequent read operation, both the upper and lower plates of the capacitors are discharged to ground potential. It will be understood that the terms 'lower plate' and 'upper plate' refer merely to the orientation of the plates of the capacitors in the schematic diagram of FIG. 4.

Continuing in FIG. 4, the current read operation ends with the snsEN control line dropping low. At this point, the snsINITB control line may be pulled low to begin the subsequent read operation. These actions cause Vfoot to be precharged to the positive supply voltage rail, which turns off MN3, MN4, and MN5 after a predetermined delay set by D0. The snsINITB control line, when asserted, triggers the delay element to null the source voltages of MN1 and MN2 to ground voltage after the predetermined delay. The delay ensures that there is time for the upper plates of capacitors C0 and C1 to complete their discharge through MN3 and MN4, even as the lower plates are charged to $V_{dd}$.

Next, as was the case for sense amplifier 14', the snsPCHGB control line is pulled low to precharge the bit lines to $V_{dd}$, while snsEN and snsINITB remain low. This action has an additional effect in sense amplifier 14, however, for when the bit lines and internal nodes are charged up, MN1 and MN2 turn on due to the positive gate bias from in/out and inb/outb. The transistors remain conductive, charging C0 and C1 until the upper plates of these capacitors reach limiting voltages, which squeeze off further conduction. In particular, the upper plates of C0 and C1 may charge to limiting values of:

$$V_{C0} = V_{dd} - V_{MN1}, \text{ and}$$

$$V_{C1} = V_{dd} - V_{MN2},$$

where the $V_{MN1}$ and $V_{MN2}$ are the gate-to-source threshold voltages of MN1 and MN2, respectively. It will be noted that as the upper-plate voltages gradually approach these values, the drive currents through MN0 and MN1 are significantly reduced, so it may take significant time for the upper plates of the capacitors to reach the limiting voltages. However, the compensation scheme here disclosed is effective even before the limiting voltages are reached.

Continuing in FIG. 4, the read operation proceeds as in the previous example, with snsPCHGB being pulled high once the bit lines are suitably charged. This action allows internal nodes in/out and inb/outb to float. At this time, snsINITB is also pulled high, preparing the sense amplifier to sense the voltage differential stored in the selected memory cell. The appropriate word line of the SRAM may now be asserted. Then, after a delay to allow the voltage differential on the bit lines to build to a suitable level, the snsEN control line is asserted. This action, as noted above pulls Vfoot and the lower plates of C0 and C1 to ground, eventually discharging the upper plates as well. However, the discharge can only occur after the delay caused by inverter D0. Before the snsEN assertion toggles through the inverter, the upper plates of the capacitors—and therefore the MN1 and MN2 sources—remain close to their limiting voltages $V_{C0}$ and $V_{C1}$. The differential source bias applied in this manner effectively compensates for any gate-to-source threshold mismatch of MN1 and MN2. In the period immediately after snsEN assertion, therefore, the difference in sink strength between MN1 and MN2 depends only on the differential gate voltage (in/out versus inb/outb), and is relatively immune to transistor mismatch.

After the delay from inverter D0, transistors MN3, MN4, and MN5 gradually pull the upper plates of C0 and C1 to ground. Thus, the IOV compensation of cross-coupled inverter stage 16 is applied only in the critical initial phase of the sense operation. After the initial phase, MN1 and MN2 sources are pulled to 'true' ground, causing the behavior of this circuit to smoothly transition to that of sense amplifier 14'. In this manner, MN1 or MN2 can fully turn on, along with the corresponding MP0 or MP1, reliably amplifying the voltage differential sensed immediately after assertion of the snsEN control line. Finally, as in the previous example, SR latch 18 latches the stored output state of cross-coupled inverter stage 16 and holds it until the next read operation is completed.

No aspect of the foregoing drawings should be understood in a limiting sense, because numerous alternative embodiments lie within the spirit and scope of this disclosure. For instance, although sense amplifier 14 uses delay element D0 to ensure that the offset voltage levels are applied to transistors MN1 and MN2 for a suitable length of time, the same functionality can be accomplished using an additional control signal. Moreover, in embodiments where a delay element is used, it need not be a series of front-to-back inverters as described above. Alternative delay elements may include a single inverter having series devices in its pull-up or pull-down paths, or a resistor-capacitor (RC) circuit, for example. Furthermore, although FIG. 4 shows two, discrete, parallel-plate capacitors C0 and C1, it will be noted that the functionality of these capacitors can be abstracted somewhat, to include other microstructural components that present a significant capacitance.

Figure 5:
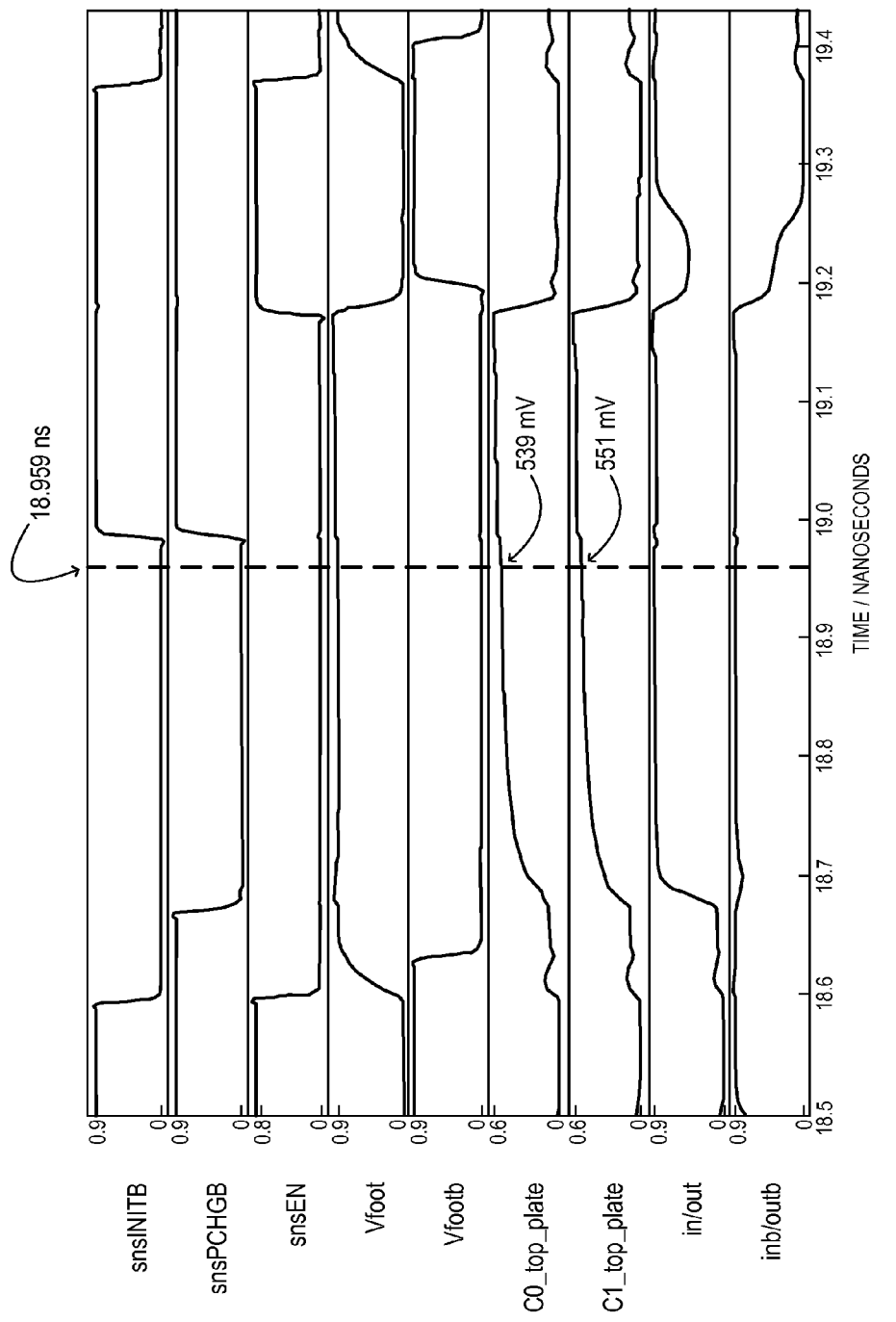
FIG. 5 shows example waveforms from various test nodes of the sense amplifier of FIG. 4.

FIG. 5 shows example waveforms from various test nodes of sense amplifier 14. The frequency of operation used in FIG. 5 is ca. 1.3 gigahertz (GHz), and $V_{dd}$ is 0.9 volts. The 12-mV difference between C0_top_plate and C1_top_plate before assertion of the snsEN control line corresponds to the gate-to-source mismatch between MN1 and MN2. In the embodiment used in FIG. 5, delay element D0 is a chain of three minimum-size CMOS inverters.

Figure 6:
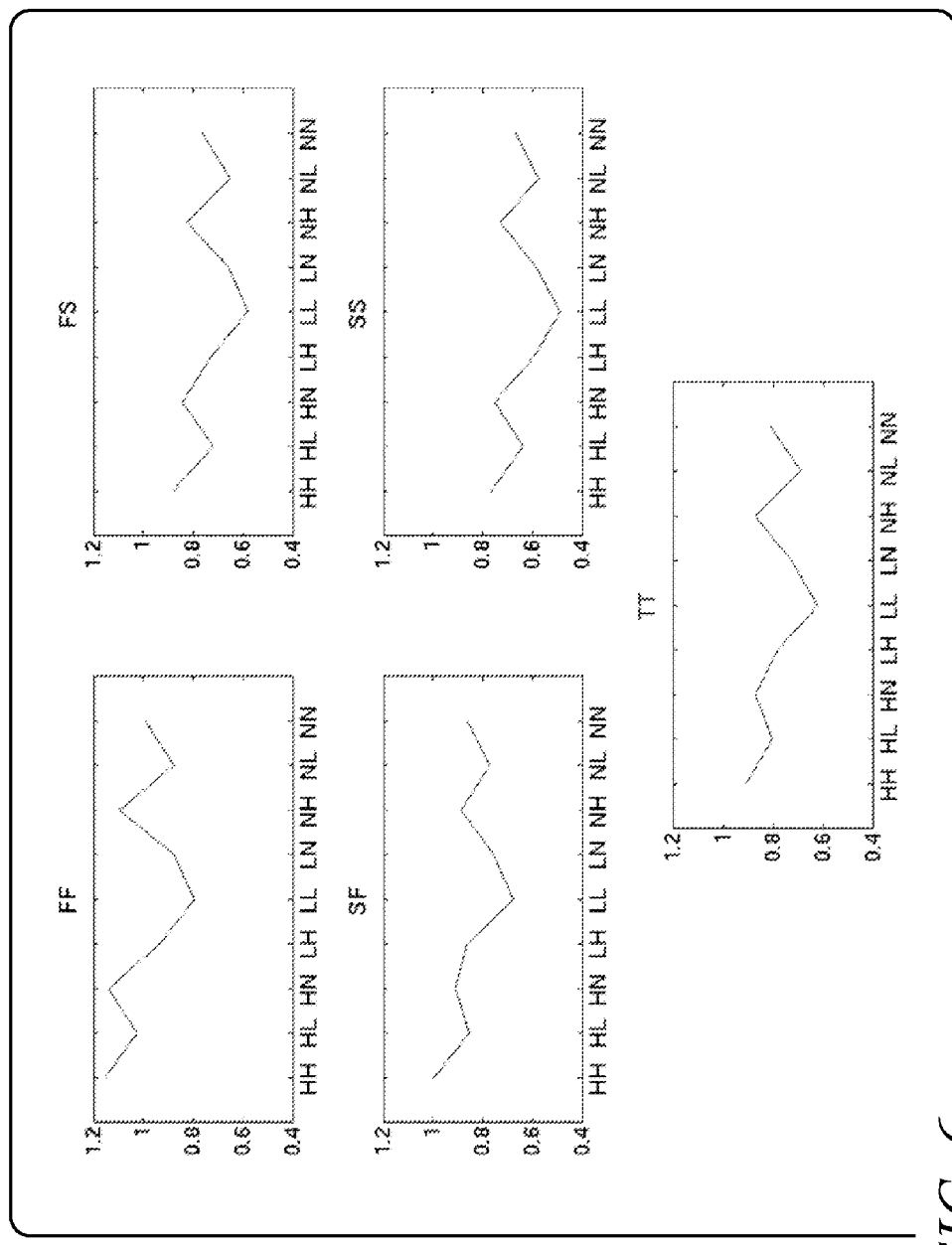
FIG. 6 shows simulated three-sigma IOV ratio plots of a sense amplifier as shown in FIG. 4 relative to a sense amplifier as shown in FIG. 3.

FIG. 6 shows a collection of simulated three-sigma IOV ratio plots for sense amplifier 14 relative to sense amplifier 14', in non-limiting embodiments. The plots span different process corners, temperatures and voltages. In each plot, a value less than one indicates less IOV in sense amplifier 14 relative to sense amplifier 14'. On the x-axis, the first letter of each label indicates the supply voltage level: H denotes 0.99 volts, and L denotes 0.90 volts. The second letter indicates the temperature: H denotes 125° C., and L denotes 0° C. Finally, the process corner represented in the plot is indicated by the two-letter title of the plot. More specifically, the two letters in the plot title stand for the global corner where the NMOS and PMOS transistors, respectively, are operating: S stands for 'slow,' F stands for 'fast,' and T stands for 'typical.' Accordingly, SF would denote a corner for slow NMOS and fast PMOS, for example. FIG. 6 shows, inter alia, that the compensation scheme described herein can reduce the three-sigma IOV of a sense-amplifier to about one-half of its uncompensated value across different operating conditions. It will be understood that the results presented in FIG. 6 compare one particular sense-amplifier embodiment to an analogous state-of-the-art circuit. These results are particular to circuit configuration, transistor sizing, etc.; they in no way limit the scope of this disclosure.

The configurations described above enable various methods for reading an SRAM array via a sense amplifier operatively coupled one column of the array. Accordingly, some such methods are now described, by way of example, with continued reference to the above configurations. It will be understood, however, that the methods here described, and others fully within the scope of this disclosure, may be enabled by other configurations as well. Naturally, each execution of a method may change the entry conditions for a subsequent execution and thereby invoke a complex decision-making logic. Such logic is fully contemplated in this disclosure. Some of the process steps described and/or illustrated herein may, in some embodiments, be omitted without departing from the scope of this disclosure. Likewise, the indicated sequence of the process steps may not always be required to achieve the intended results, but is provided for ease of illustration and description. One or more of the illustrated actions, functions, or operations may be performed repeatedly, depending on the particular strategy being used.

Figure 7:
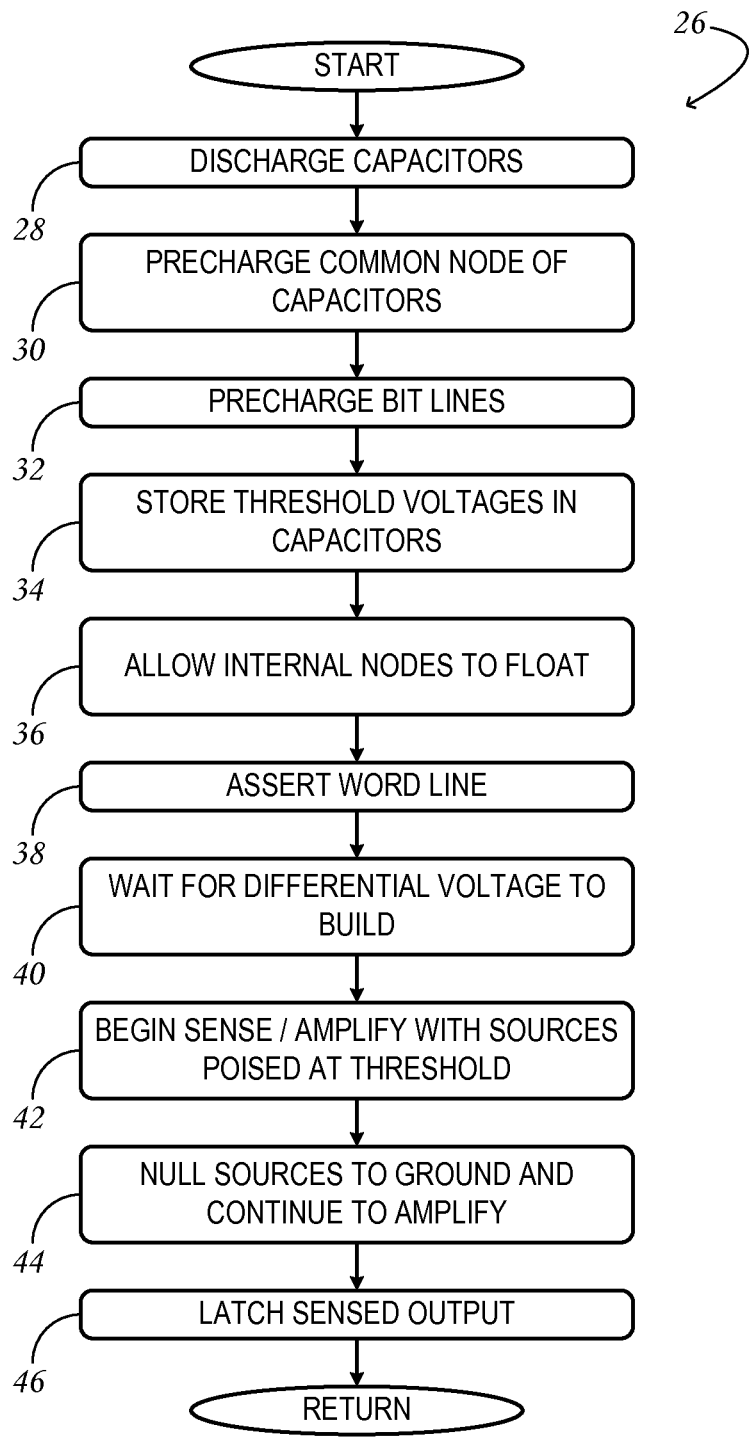
FIG. 7 illustrates an example method for reading an SRAM array via a sense amplifier operatively coupled to one column of the array, in accordance with an embodiment of this disclosure.

FIG. 7 illustrates an example method 26 for reading an SRAM array via a sense amplifier operatively coupled to one column of the array. In the SRAM envisaged, a selected memory cell drives a developing voltage differential according to a logic state stored in the memory cell.

At 28 of method 26, capacitors C0 and C1, which are to store the offset voltage levels transistors MN1 and MN2, respectively, are discharged. This action may begin with assertion of a snsEN control line, which pulls a common node of the capacitors—e.g., the lower plates or Vfoot in FIG. 4—to a low logic level. After a predetermined delay, a set of transistors are turned on, which null the upper plates of the capacitors as well.

At 30 the common node of capacitors C0 and C1 is precharged to a positive voltage while the upper plates continue to discharge. This action may be triggered by dropping the snsEN control line and asserting the snsINITB control line. Further execution of the method may be delayed, then, until the common node of the capacitors has gone high and the complementary Vfootb node has gone low.

At 32 of method 26, complementary bit lines BL and BLB are precharged to a positive reference voltage. During this time, voltage levels offset by the threshold voltages of MN1 and MN2 are stored on the upper plates of capacitors C0 and C1, which are coupled, respectively, to the source terminals of MN1 and MN2. As noted above, each threshold voltage referred to herein may be a gate-to-source threshold voltage below which the associated transistor stops passing current. In the embodiments here contemplated, the difference in offset voltage levels may substantially equal the difference in the threshold voltages of the transistors. In one embodiment, storing the offset voltage levels includes connecting the drain and gate of each transistor to a common voltage level, and allowing the source voltages of each transistor to increase until each transistor stops passing current. Because the offset voltage levels are stored in capacitors C0 and C1, the source voltages of MN1 and MN2 remain poised at these levels at the outset of sense amplification. The storing actions described here may be triggered by assertion of a snsPCHGB control line while the snsEN control line remains dropped and the snsINITB control line remains asserted. They may be followed by a waiting period in which bit lines BL and BLB are charge to the desired level.

Method 26 then continues to 36, where the internal sensing nodes (in/out and inb/outb in FIG. 4) are allowed to float. This action may be triggered by dropping the snsEN control line and asserting the snsINITB control line, to place the sense amplifier in a condition to sense the voltage differential between in/out and inb/outb.

At 38 of method 26, a word line of one row of the array is asserted to select one memory cell for each column. Assertion of the word line effectively links the selected memory cell to the sense amplifier, thereby causing a voltage differential to develop on complementary bit lines of the column according to a logic state of the selected memory cell. Such assertion occur priors to initiating sensing and amplification of the voltage differential. In some embodiments, it may be followed, at 40, by a suitable waiting period during which the voltage differential across the bit lines is allowed to develop to a predetermined level sufficient for reliable sense amplification.

At 42, sensing and amplification of the voltage differential is initiated, with the source voltages of MN1 and MN2 poised at their respective offset voltage levels. More particularly, the voltage differential across the bit lines is applied between the gate of transistor MN1 and the gate of transistor MN2. This action may be triggered by assertion of the snsEN control line. At 44, after a predetermined delay following initiation of sensing and amplification of the voltage differential, the source voltages of transistors MN1 and MN2 are nulled to ground voltage. In this embodiment, the cross-coupled inverter stage of the sense amplifier continues to amplify the voltage differential while the source voltages are maintained at ground voltage.

In these and other embodiments, sensing and amplification of the voltage differential in the cross-coupled inverter stage causes the logic state of the selected memory cell to be stored in the cross-coupled inverter stage of the sense amplifier. Notably, the offset voltage levels of the MN1 and MN2 transistors may be stored anew prior to every read operation of the sense amplifier. This feature makes the disclosed compensation scheme substantially immune to temperature-induced drift of the threshold voltages of the transistors. Finally, at 46 of method 26, the stored logic state is latched in a latch stage of the sense amplifier.

It will be understood that the articles, systems, and methods described hereinabove are embodiments of this disclosure—non-limiting examples for which numerous variations and extensions are contemplated as well. This disclosure also includes all novel and non-obvious combinations and subcombinations of the above articles, systems, and methods, and any and all equivalents thereof.

The invention claimed is:

1. A sense amplifier for an electronic memory array in which a selected memory cell drives a developing voltage differential according to a logic state of the memory cell, the sense amplifier comprising:
    a cross-coupled inverter stage having opposing first and second transistors, the cross-coupled inverter stage configured to sense and amplify the voltage differential when applied between a gate of the first transistor and a gate of the second transistor, and to store the logic state based on the amplified voltage differential; and
    a compensation stage configured to poise source voltages of the first and second transistors at levels offset, respectively, by threshold voltages of the first and second transistors, wherein the compensation stage includes first and second capacitors having first plates coupled, respectively, to source terminals of the first and second transistors, the first and second capacitors coupled to a common voltage node at second plates that are opposite the first plates, and wherein the compensation stage is further configured to store the offset voltage level of the first transistor on the first capacitor and the offset voltage level of the second transistor on the second capacitor, the common voltage node driven to a voltage higher than ground voltage in response to assertion of a first control line when the offset voltage level of the first transistor is stored on the first capacitor and the offset voltage level of the second transistor is stored on the second capacitor, wherein assertion of the first control line also triggers a predetermined delay during which the source voltages of the first and second transistors remain at their respective offset voltage levels; wherein upon expiration of the predetermined delay, a second control line is asserted to initiate sensing and amplification of the voltage differential by the sense amplifier in a read operation.

2. The sense amplifier of claim 1 wherein the compensation stage includes a set of transistors configured to null the source voltages of the first and second transistors to ground voltage after the predetermined delay, during which the source voltages are poised at the offset voltage levels.

3. The sense amplifier of claim 2 wherein the compensation stage includes a delay element configured to control the set of transistors such that the source voltages of the first and second transistors are nulled only after the predetermined delay.

4. The sense amplifier of claim 3 wherein the delay element includes an inverter chain.

5. The sense amplifier of claim 3 wherein the first control line, when asserted, triggers the delay element to null the source voltages of the first and second transistors to ground voltage after the predetermined delay.

6. The sense amplifier of claim 1 wherein assertion of the second control line pulls the voltage at the common voltage node to a low logic level, causing the first and second plates of the first and second capacitors to be discharged to ground.

7. The sense amplifier of claim 6 wherein the first and second control lines are dropped low to end the read operation, causing the voltage at the common voltage node to increase, which turns off the set of transistors.

8. The sense amplifier of claim 7 wherein, after the end of the read operation, a third control line is pulled low to begin precharging bit lines coupled to the selected memory cell and is then asserted in response to the bit lines being precharged, causing the first control line to also be asserted, wherein a word line associated with the selected memory cell is also then asserted to begin another read operation.

\* \* \* \* \*